US011968876B2

(12) United States Patent
Jeon et al.

(10) Patent No.: US 11,968,876 B2
(45) Date of Patent: Apr. 23, 2024

(54) DISPLAY DEVICE

(71) Applicant: Samsung Display Co., Ltd., Yongin-si (KR)

(72) Inventors: Kyungjin Jeon, Incheon (KR); Joon-seok Park, Yongin-si (KR); Kwang-suk Kim, Suwon-si (KR); Taesang Kim, Seoul (KR); Yeon-keon Moon, Hwaseong-si (KR); Geunchul Park, Suwon-si (KR); Jun-hyung Lim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 440 days.

(21) Appl. No.: 17/283,714

(22) PCT Filed: Feb. 1, 2019

(86) PCT No.: PCT/KR2019/001485
§ 371 (c)(1),
(2) Date: Apr. 8, 2021

(87) PCT Pub. No.: WO2020/075923
PCT Pub. Date: Apr. 16, 2020

(65) Prior Publication Data
US 2021/0327964 A1 Oct. 21, 2021

(30) Foreign Application Priority Data
Oct. 8, 2018 (KR) .................. 10-2018-0119623

(51) Int. Cl.
*H10K 59/38* (2023.01)
*H10K 50/844* (2023.01)
(Continued)

(52) U.S. Cl.
CPC ........... *H10K 59/38* (2023.02); *H10K 50/844* (2023.02); *H10K 50/865* (2023.02);
(Continued)

(58) Field of Classification Search
None
See application file for complete search history.

(56) References Cited

U.S. PATENT DOCUMENTS 6,967,435 B2    11/2005  Park et al.
8,188,649 B2 *   5/2012  Sung .................... H10K 50/828
                                                       313/503
(Continued)

FOREIGN PATENT DOCUMENTS

CN    104835831 A    8/2015
CN    107004699 A    8/2017
(Continued)

OTHER PUBLICATIONS

Korean Notice of Allowance for Application No. 10-2018-0119623, dated Apr. 7, 2023, 8 pages.
(Continued)

*Primary Examiner* — Evren Seven
(74) *Attorney, Agent, or Firm* — Lewis Roca Rothgerber Christie LLP

(57) ABSTRACT

A display device includes a base substrate including a first sub-pixel area, a second sub-pixel area, and a third sub-pixel area, first to third thin film transistors on the base substrate and including first to third active patterns, respectively, first to third pixel electrodes electrically connected to the first to third thin film transistors, respectively and in the first to third sub-pixel areas, respectively, a blue light emitting layer on the first to third pixel electrodes and configured to emit a blue light, a first color conversion pattern in the first sub-pixel area on the blue light emitting layer, a second color
(Continued)

conversion pattern in the second sub-pixel area on the blue light emitting layer, and a red color filter layer between the blue light emitting layer and the first to third active patterns.

20 Claims, 7 Drawing Sheets

(51) Int. Cl.
  *H10K 50/86* (2023.01)
  *H10K 59/121* (2023.01)
  *H10K 59/126* (2023.01)
  *H01L 27/12* (2006.01)
  *H01L 29/786* (2006.01)

(52) U.S. Cl.
  CPC ....... *H10K 59/1213* (2023.02); *H10K 59/126* (2023.02); *H01L 27/1225* (2013.01); *H01L 29/78633* (2013.01); *H01L 29/7869* (2013.01)

(56) References Cited

U.S. PATENT DOCUMENTS

| | | | |
|---|---|---|---|
| 9,029,897 | B2 | 5/2015 | Choi et al. |
| 2003/0146696 | A1 | 8/2003 | Park et al. |
| 2008/0024479 | A1 | 1/2008 | Jung et al. |
| 2014/0103308 | A1 | 4/2014 | Choi et al. |
| 2015/0263077 | A1 | 9/2015 | Kim et al. |
| 2016/0254276 | A1* | 9/2016 | Tada ................. H01L 29/78648 257/72 |
| 2018/0219183 | A1* | 8/2018 | Song .................... H10K 50/852 |
| 2019/0295996 | A1* | 9/2019 | Park ....................... H01L 33/502 |
| 2021/0091159 | A1* | 3/2021 | Lee ......................... H10K 59/88 |

FOREIGN PATENT DOCUMENTS

| | | |
|---|---|---|
| KR | 10-2003-0057634 A | 7/2003 |
| KR | 10-2008-0011829 A | 2/2008 |
| KR | 10-0834342 B1 | 6/2008 |
| KR | 10-2013-0008892 A | 1/2013 |
| KR | 10-2014-0047332 A | 4/2014 |
| KR | 10-2014-0057839 A | 5/2014 |
| KR | 10-2017-0079626 A | 7/2017 |
| KR | 10-2017-0110950 A | 10/2017 |
| KR | 10-2017-0126535 A | 11/2017 |
| KR | 10-2018-0002274 A | 1/2018 |
| KR | 10-2018-0013577 A | 2/2018 |
| KR | 10-2018-0019794 A | 2/2018 |
| KR | 10-2018-0034856 A | 4/2018 |
| KR | 10-1859105 | 5/2018 |

OTHER PUBLICATIONS

International Search Report for Application No. PCT/KR2019/001485, dated Jul. 8, 2019, 4 pages.

Office Action issued by the Chinese Patent Office for Application No. 201980063011.5, dated Jan. 18, 2024, 8 pages.

* cited by examiner

DISPLAY DEVICE

CROSS-REFERENCE TO RELATED APPLICATIONS

This application is a National Phase Patent Application and claims priority to and the benefit of International Application Number PCT/KR2019/001485, filed on Feb. 1, 2019, which claims priority to Korean Patent Application Number 10-2018-0119623, filed on Oct. 8, 2018, the entire contents of all each of which are incorporated herein by reference.

TECHNICAL FIELD

Embodiments of the present disclosure relate to a display device. For example, embodiments of the present inventive concept relate to an organic light emitting diode display device including a color conversion structure such as quantum dots.

BACKGROUND

Recently, as the technology improves, display products having smaller sizes, lighter weights, and superior performance have been produced. Conventional cathode ray tube (CRT) televisions had been widely used for display devices with many advantages in terms of performance and price. Recently, however, display devices such as plasma display devices, liquid crystal display devices, and organic light emitting diode display devices that overcome weak points of the CRT in terms of miniaturization or portability and have advantages such as miniaturization, light weight, and low power consumption have been spotlighted.

In order to improve color reproducibility and luminous efficiency, a display device including a color conversion structure such as quantum dots has been developed. However, the display device may have a structure different from a structure of a conventional display device, so that display quality may be degraded.

CONTENT OF THE INVENTION

Problem to be Solved

Embodiments of the present disclosure provide a display device including a color conversion structure such as quantum dots and a light emitting structure, in which display quality is improved.

Means for Solving the Problem

According to embodiments of the present disclosure, a display device may include a base substrate including a first sub-pixel area, a second sub-pixel area, and a third sub-pixel area, first to third thin film transistors disposed on the base substrate and including first to third active patterns, respectively, first to third pixel electrodes electrically connected to the first to third thin film transistors, respectively and disposed in the first to third sub-pixel areas, respectively, a blue light emitting layer disposed on the first to third pixel electrodes and configured to emit a blue light, a first color conversion pattern disposed in the first sub-pixel area on the blue light emitting layer, a second color conversion pattern disposed in the second sub-pixel area on the blue light emitting layer, and a red color filter layer disposed between the blue light emitting layer and the first to third active patterns.

In embodiments, the first color conversion pattern may include at least one selected from red quantum dot particles and a red phosphor. In addition, the second color conversion pattern may include at least one selected from green quantum dot particles and a green phosphor.

In embodiments, the display device may further include a first color filter disposed on the first color conversion pattern and a second color filter disposed on the second color conversion pattern.

In embodiments, the first color filter and the red color filter layer may include the same material.

In embodiments, the display device may further include a transmissive pattern disposed in the third sub-pixel area on the blue light emitting layer, a third color filter disposed on the transmissive pattern, a counter substrate facing the base substrate, a first insulating layer disposed between the counter substrate and the first color conversion pattern, between the counter substrate and the second color conversion pattern, and between the counter substrate and the transmissive pattern, the first insulating layer including an inorganic insulating material, and a second insulating layer disposed between the blue light emitting layer and the first color conversion pattern, between the blue light emitting layer and the second color conversion pattern, and between the blue light emitting layer and the transmissive pattern, the second insulating layer including an inorganic insulating material.

In embodiments, the display device may further include the counter electrode disposed on the blue light emitting layer, a thin film encapsulation layer disposed on the counter electrode, and an adhesive layer disposed between the thin film encapsulation layer and the second insulating layer.

In embodiments, the blue light emitting layer may be commonly formed in the first to third sub-pixel areas.

In embodiments, the display device may further include a via insulating layer disposed between the red color filter layer and the first to third pixel electrodes and including an organic material. In addition, the first to third pixel electrodes may be electrically connected to the first to third thin film transistors, respectively, through contact holes formed through the via insulating layer and the red color filter layer.

In embodiments, the display device may further include a via insulating layer disposed between the red color filter layer and the first to third thin film transistors and may include an organic material. In addition, the first to third pixel electrodes may be electrically connected to the first to third thin film transistors, respectively, through contact holes formed through the red color filter layer and the via insulating layer.

In embodiments, the red color filter layer may be disposed between the first to third pixel electrodes and the first to third thin film transistors and may have a flat top surface. In addition, the first to third pixel electrodes may be electrically connected to the first to third thin film transistors through contact holes formed through the red color filter layer, respectively.

In embodiments, the display device may further include a via insulating layer disposed between the first to third pixel electrodes and the first to third thin film transistors and including an organic material. In addition, the first to third pixel electrodes may be electrically connected to the first to third thin film transistors through contact holes formed through the via insulating layer, respectively. Further, the red color filter layer may be a pixel defining layer disposed on the via insulating layer on which the first to third pixel electrodes are disposed and having openings that partially expose the first to third pixel electrodes, respectively.

In embodiments, the red color filter layer may overlap the first to third thin film transistors.

In embodiments, the first to third active patterns may include an oxide semiconductor.

In embodiments, the first to third thin film transistors may further include first to third gate electrodes, first to third source electrodes, and first to third drain electrodes, respectively. In addition, the display device may further include a gate insulating layer disposed between the first to third active patterns and the first to third gate electrodes and an interlayer insulating layer disposed on the gate insulating layer on which the first to third gate electrodes are disposed. Further, the first to third active patterns may be disposed between the gate insulating layer and the base substrate.

In embodiments, the display device may further include first to third lower shielding electrodes disposed between the base substrate and the first to third active patterns, respectively.

According to embodiments, a display device may include a first sub-pixel configured to emit a red light, a second sub-pixel configured to emit a green light, and a third sub-pixel configured to emit a blue light. The first sub-pixel may include a first thin film transistor, a first blue light emitting layer, and a red color conversion pattern disposed on the first blue light emitting layer. The second sub-pixel may include a second thin film transistor, a second blue light emitting layer, and a green color conversion pattern disposed on the second blue light emitting layer. The third sub-pixel may include a third thin film transistor and a third blue light emitting layer. The display device may further include a red color filter layer disposed between the first thin film transistor and the first blue light emitting layer, between the second thin film transistor and the second blue light emitting layer, and between the third thin film transistor and the third blue light emitting layer.

In embodiments, the first to third thin film transistors may include an oxide semiconductor.

In embodiments, the first color conversion pattern may include at least one selected from red quantum dot particles and a red phosphor. In addition, the second color conversion pattern may include at least one selected from green quantum dot particles and a green phosphor.

In embodiments, the first to third blue light emitting layers of the first to third sub-pixels may be commonly formed and connected to each other.

In embodiments, the red color filter layer may overlap the first to third thin film transistors.

Effects of the Invention

According to embodiments of the present inventive concept, a display device may include a thin film transistor including an oxide semiconductor, a blue light emitting layer, a color conversion pattern, and a red color filter layer. The display device may include a color conversion structure such as quantum dots to improve color reproducibility so that display quality can be improved, and the red color filter layer may prevent a blue light generated from the blue light emitting layer from affecting the thin film transistor including the oxide semiconductor. Accordingly, the display quality can be improved.

However, the effects of the present inventive concept are not limited thereto. Thus, the effects of the present inventive concept may be extended without departing from the spirit and the scope of the present inventive concept.

PARTICULAR CONTENTS FOR IMPLEMENTING THE INVENTION

Hereinafter, embodiments of the present inventive concept will be explained in detail with reference to the accompanying drawings.

Figure 1:
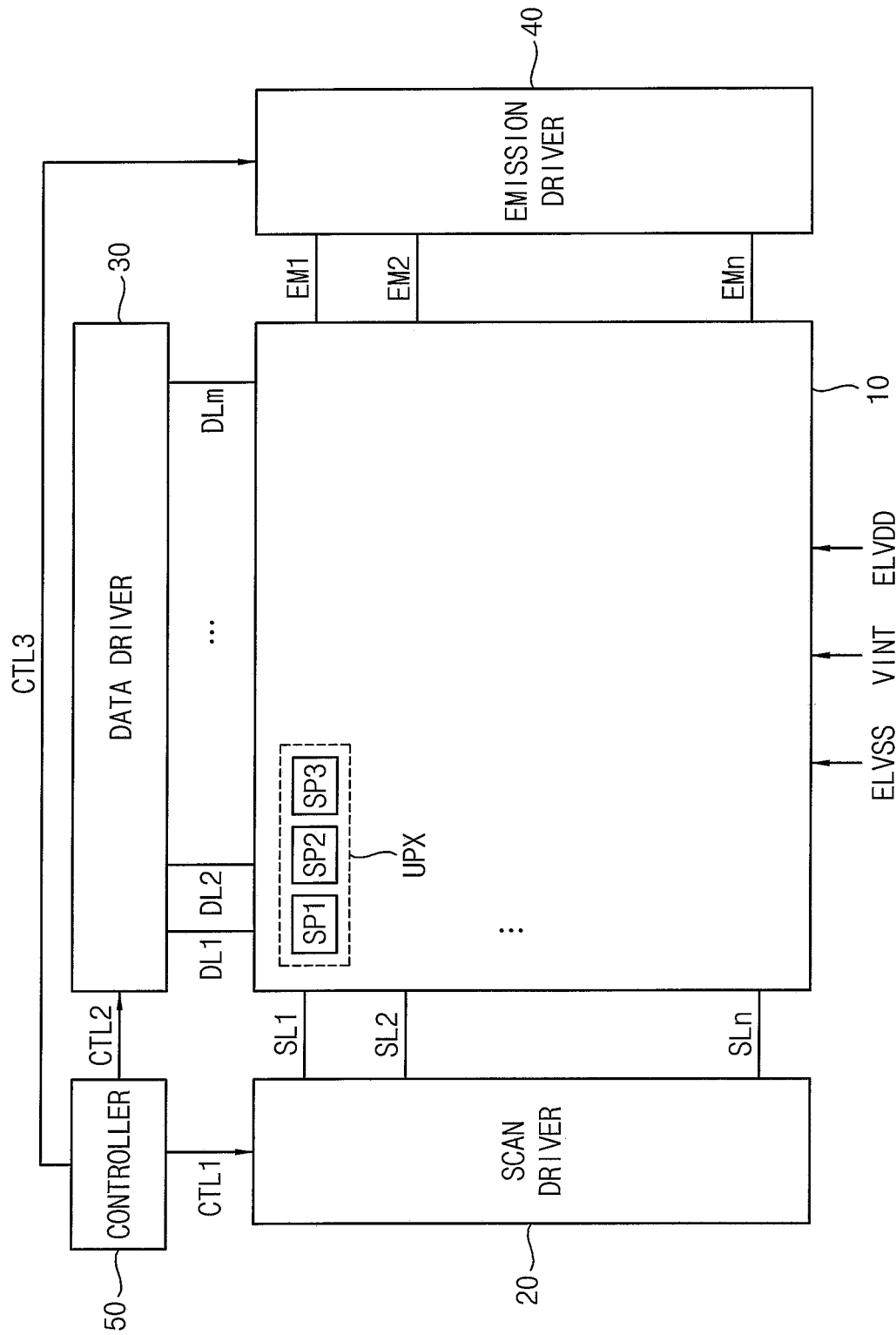
FIG. 1 is a block diagram illustrating a display device according to embodiments.

FIG. 1 is a block diagram illustrating a display device according to embodiments.

Referring to FIG. 1, a display device may include a display panel 10, a scan driver 20, a data driver 30, an emission control driver 40, and a controller 50.

The display panel 10 may include a plurality of pixel units UPX for displaying an image. The pixel unit UPX may include a first sub-pixel SP1, a second sub-pixel SP2, and a third sub-pixel SP3 that emit different color lights, respectively. In other words, the first sub-pixel SP1 may emit a first color light, the second sub-pixel SP2 may emit a second color light, and the third sub-pixel SP3 may emit a third color light. For example, the first sub-pixel SP1 may be a red sub-pixel configured to emit a red light, the second sub-pixel SP2 may be a green sub-pixel configured to emit a green light, and the third sub-pixel SP3 may be a blue sub-pixel configured to emit a blue light.

For example, the display panel 10 may include n*m sub-pixels located at intersecting portions of scan lines SL1 to SLn and data lines DL1 to DLm (where each of n and m is an integer greater than 1). Each of the sub-pixels may include at least one transistor and at least one storage capacitor.

The scan driver 20 may sequentially provide a first scan signal to the sub-pixels through the scan lines SL1 to SLn based on a first control signal CTL1.

The data driver 30 may provide a data signal to the sub-pixels through the data lines DL1 to DLm based on a second control signal CTL2.

The emission control driver 40 may sequentially provide an emission control signal to the sub-pixels through emission control lines EM1 to EMn based on a third control signal CTL3.

The controller 50 may control the scan driver 20, the data driver 30, and the emission control driver 40. The controller 50 may generate the control signals CTL1 to CTL3 to control the scan driver 20, the data driver 30, and the emission control driver 40, respectively. The first control signal CTL1 for controlling the scan driver 20 may include a scan start signal, a scan clock signal, and/or the like. The second control signal CTL2 for controlling the data driver 30 may include image data, a horizontal start signal, and/or the like. The third control signal CTL3 for controlling the emission control driver 40 may include an emission control start signal, an emission control clock signal, and/or the like.

In addition, the display device may further include a power supply unit (not shown) configured to supply a first power supply voltage ELVDD, a second power supply voltage ELVSS, and an initialization voltage VINT to the display panel 10.

Figure 2:
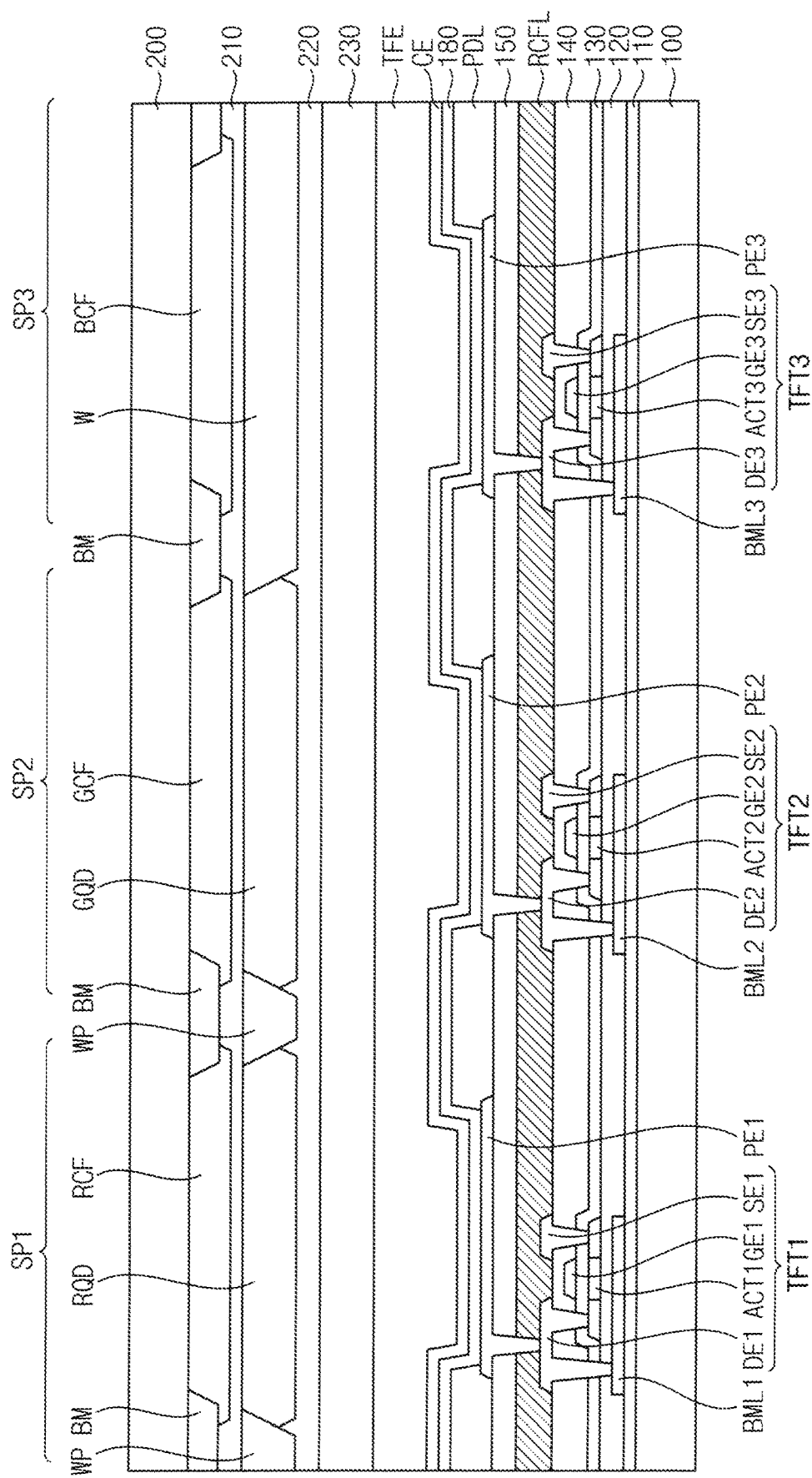
FIG. 2 is a sectional view showing first to third sub-pixels of the display device of FIG. 1.

FIG. 2 is a sectional view showing first to third sub-pixels of the display device of FIG. 1.

Referring to FIG. 2, the display device may include a base substrate 100, a first buffer layer 110, a lower shielding electrode, a second buffer layer 120, an active pattern layer, a gate insulating layer 130, a gate pattern, an interlayer insulating layer 140, a source/drain pattern, a red color filter layer RCFL, a via insulating layer 150, a pixel electrode layer, a pixel defining layer PDL, a blue light emitting layer 180, a counter electrode CE, a thin film encapsulation layer TFE, an adhesive layer 230, a second insulating layer 220, a QD layer, a first insulating layer 210, a color filter layer, a light blocking pattern BM, and a counter substrate 200.

The base substrate 100 may include a transparent insulating substrate. For example, the base substrate 100 may be configured as a glass substrate, a quartz substrate, a transparent resin substrate, and/or the like. In this case, the transparent resin substrate may include a polyimide-based resin, an acryl-based resin, a polyacrylate-based resin, a polycarbonate-based resin, a polyether-based resin, a sulfonic acid-based resin, a polyethylene terephthalate-based resin, and/or the like.

The base substrate 100 may include a first sub-pixel area corresponding to the first sub-pixel SP1, a second sub-pixel area corresponding to the second sub-pixel SP2, and a third sub-pixel area corresponding to the third sub-pixel SP3. The first to third sub-pixel areas may be partitioned by the light blocking pattern BM that will be described below.

The first buffer layer 110 may be disposed over the whole base substrate 100. The first buffer layer 110 may prevent metal atoms or impurities from diffusing from the base substrate 100 into the active pattern layer.

The lower shielding electrode may be disposed on the buffer layer 110. The lower shielding electrode may prevent characteristics of a thin film transistor, which will be described below, from being degraded. For example, when the base substrate 100 includes polyimide, a mobile charge may be generated, and the mobile charge may affect a semiconductor layer of the thin film transistor and reduce a driving current. In such cases, the lower shielding electrode may prevent a decrease in the amount of a current in the semiconductor layer due to a flow of charges in a polyimide (PI) layer.

The lower shielding electrode may be in a floating state, or may be connected to a drain electrode of each thin film transistor as shown in FIG. 2. Although the lower shielding electrode has been described according to the present embodiment as being connected to the drain electrode, the lower shielding electrode may be connected to other constant voltage sources having a constant voltage level. The lower shielding electrode may be formed to correspond to each thin film transistor, TFT1, TFT2, TFT3, and may include a first lower shielding electrode BML1, a second lower shielding electrode BML2, and a third lower shielding electrode BML3, respectively, as shown FIG. 2.

The second buffer layer 120 may be disposed on the first buffer layer 110 on which the lower shielding electrode is disposed. The second buffer layer 120 may be disposed over the whole base substrate 100. The second buffer layer 120 may prevent metal atoms or impurities from diffusing from the base substrate 100 into the active pattern layer.

The active pattern layer may include a first active pattern ACT1, a second active pattern ACT2, and a third active pattern ACT3. The active pattern layer may be a semiconductor oxide layer including a binary compound ($AB_x$), a ternary compound ($AB_xC_y$), a quaternary compound ($AB_xC_yD_z$), and/or the like that contains indium (In), zinc (Zn), gallium (Ga), tin (Sn), titanium (Ti), aluminum (Al), hafnium (Hf), zirconium (Zr), magnesium (Mg), and/or the like. For example, the active pattern layer may include zinc oxide ($ZnO_x$), gallium oxide ($GaO_x$), titanium oxide ($TiO_x$), tin oxide ($SnO_x$), indium oxide ($InO_x$), indium-gallium oxide (IGO), indium-zinc oxide (IZO), indium-tin oxide (ITO), gallium-zinc oxide (GZO), zinc-magnesium oxide (ZMO), zinc-tin oxide (ZTO), zinc-zirconium oxide ($ZnZr_xO_y$), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), and/or the like.

Each of the first to third active patterns ACT1, ACT2, and ACT3 may include a drain region and a source region that are doped with impurities, and a channel region disposed between the drain region and the source region.

The gate insulating layer 130 may be disposed on the second buffer layer 120 on which the active pattern layer is disposed. The gate insulating layer 130 may be disposed along a profile of the active pattern layer with substantially the same thickness to cover the active pattern layer on the second buffer layer 120. The gate insulating layer 130 may include an inorganic insulating material such as a silicon compound and/or a metal oxide.

The gate pattern may be disposed on the gate insulating layer 130. The gate pattern may include a first gate electrode GE1, a second gate electrode GE2, a third gate electrode GE3, and a signal line configured to transmit a signal for driving the display device, such as a gate line. The gate pattern may include a metal. In addition, the gate pattern may include a plurality of metal layers.

The interlayer insulating layer 140 may be disposed on the gate insulating layer 130 on which the gate pattern is disposed. The interlayer insulating layer 140 may sufficiently cover the gate pattern on the gate insulating layer 130, and may have a substantially flat top surface without creating a step around the gate pattern. The interlayer insulating layer 140 may include an inorganic insulating material such as a silicon compound and/or a metal oxide.

The source/drain pattern may be disposed on the interlayer insulating layer 140. The source/drain pattern may include a first source electrode SE1, a first drain electrode DE1, a second source electrode SE2, a second drain electrode DE2, a third source electrode SE3, and a third drain electrode DE3. The source/drain pattern may include a metal. In addition, the source/drain pattern may include a plurality of metal layers. The first source electrode SE1 and the first drain electrode DE1 may be electrically connected to the first active pattern ACT1 through contact holes formed through the interlayer insulating layer 140 and the gate insulating layer 130. The second source electrode SE2 and the second drain electrode DE2 may be electrically connected to the second active pattern ACT2 through contact holes formed through the interlayer insulating layer 140 and the gate insulating layer 130. The third source electrode SE3 and the third drain electrode DE3 may be electrically connected to the third active pattern ACT3 through contact holes formed through the interlayer insulating layer 140 and the gate insulating layer 130.

In these embodiments, the first to third drain electrodes DE1, DE2, and DE3 may be electrically connected to the first to third lower shield electrodes BML1, BML2, and BML3 corresponding to the first to third drain electrodes DE1, DE2, and DE3, respectively, through contact holes formed through the interlayer insulating layer 140, the gate insulating layer 130, and the second buffer layer 120.

A first thin film transistor TFT1 may include the first gate electrode GE1, the first active pattern ACT1, the first source electrode SE1, and the first drain electrode DE1. A second thin film transistor TFT2 may include the second gate electrode GE2, the second active pattern ACT2, the second source electrode SE2, and the second drain electrode DE2. A third thin film transistor TFT3 may include the third gate electrode GE3, the third active pattern ACT3, the third source electrode SE3, and the third drain electrode DE3.

The red color filter layer RCFL may be disposed on the interlayer insulating layer 140 on which the source/drain pattern is disposed. The red color filter layer RCFL may allow a wavelength band of a passing light that corresponds to a red light to pass therethrough, and may block a blue light. In other words, a blue light generated from the blue light emitting layer 180 may be blocked by the red color filter layer RCFL, so that the blue light may be prevented from being incident on the first to third active patterns ACT1, ACT2, and ACT3 of the first to third thin film transistors TFT1, TFT2, and TFT3. Accordingly, a change in characteristics of the first to third thin film transistors TFT1, TFT2, and TFT3 due to the blue light generated from the blue light emitting layer 180 may be minimized. In particular, when the first to third thin film transistors TFT1, TFT2, and TFT3 include an oxide semiconductor, the change in characteristics due to the blue light may be large. Therefore, as the red color filter layer RCFL blocks the blue light, negative bias illumination stress stability (NBIS) of the first to third thin film transistors TFT1, TFT2, and TFT3 may be improved. Accordingly, display quality can be improved.

The via insulating layer 150 may be disposed on the red color filter layer RCFL. The via insulating layer 150 may have a single layer structure or may have a multilayer structure including at least two or more insulating films. The via insulating layer 150 may be formed by using an organic material such as a photoresist, an acryl-based resin, a polyimide-based resin, a polyimide-based resin, and/or a siloxane-based resin.

The pixel electrode layer may be disposed on the via insulating layer 150. The pixel electrode layer may include a first pixel electrode PE1, a second pixel electrode PE2, and a third pixel electrode PE3. The pixel electrode layer may be formed by using a reflective material. In some embodiments, the pixel electrode layer may have a single-layer structure or a multilayer structure including a metal film, an alloy film, a metal nitride film, a conductive metal oxide film, and/or a transparent conductive material film.

The first pixel electrode PE1 may be disposed in the first sub-pixel area. The first pixel electrode PE1 may be electrically connected to the first drain electrode DE1 of the first thin film transistor TFT1 through contact holes formed through the via insulating layer 150 and the red color filter layer RCFL.

The second pixel electrode PE2 may be disposed in the second sub-pixel area. The second pixel electrode PE2 may be electrically connected to the second drain electrode DE2 of the second thin film transistor TFT2 through contact holes formed through the via insulating layer 150 and the red color filter layer RCFL.

The third pixel electrode PE3 may be disposed in the third sub-pixel area. The third pixel electrode PE3 may be electrically connected to the third drain electrode DE3 of the third thin film transistor TFT3 through contact holes formed through the via insulating layer 150 and the red color filter layer RCFL.

The pixel defining layer PDL may be disposed on the via insulating layer 150 on which the pixel electrode layer is disposed. The pixel defining layer PDL may be formed by using an organic material, an inorganic material, and/or the like. For example, the pixel defining layer PDL may be formed by using a photoresist, a polyacryl-based resin, a polyimide-based resin, an acryl-based resin, a silicone compound, and/or the like. According to some embodiments, the pixel defining layer PDL may be etched to form openings that partially expose the first to third pixel electrodes PE1, PE2, and PE3, respectively. An emission area and a non-emission area of the display device may be defined by the openings of the pixel defining layer PDL. For example, a portion where the openings of the pixel defining layer PDL are located may correspond to the emission area, and the non-emission area may correspond to a portion adjacent to the openings of the pixel defining layer PDL.

The blue light emitting layer 180 may be disposed on the pixel defining layer PDL and the first to third pixel electrodes PE1, PE2, and PE3. The blue light emitting layer 180 may have a multilayer structure including an organic emission layer, a hole injection layer, a hole transport layer, an electron transport layer, an electron injection layer, and/or the like. The blue light emitting layer 180 may be commonly formed to correspond to a plurality of pixels. The organic emission layer of the blue light emitting layer 180 may be formed by using light emitting materials for generating a blue light. Meanwhile, although the blue light emitting layer 180 has been described in the present embodiment as being commonly formed to correspond to the pixels, the blue light emitting layer 180 may be formed to correspond to each of the pixels.

The counter electrode CE may be disposed on the blue light emitting layer 180. The counter electrode CE may include a transmissive material. In some embodiments, the counter electrode CE may have a single-layer structure or a multilayer structure including a metal film, an alloy film, a metal nitride film, a conductive metal oxide film, and/or a transparent conductive material film.

The thin film encapsulation layer TFE may be disposed on the counter electrode CE. The thin film encapsulation layer TFE may prevent moisture and oxygen from penetrating from an outside. The thin film encapsulation layer TFE may include at least one organic layer and at least one inorganic layer. The at least one organic layer and the at least one inorganic layer may be alternately stacked on each other. For example, the thin film encapsulation layer TFE may include two inorganic layers and an organic layer interposed therebetween, but embodiments are not limited thereto.

The adhesive layer 230 may be disposed on the thin film encapsulation layer TFE. The adhesive layer 230 may be used to bond the base substrate 100 on which the thin film encapsulation layer TFE is formed to the counter substrate 200 on which the second insulating layer 220 is formed.

The second insulating layer 220 may be disposed on the adhesive layer 230. The second insulating layer 220 may cover the QD layer. For example, the second insulating layer 220 may include an inorganic insulating material such as silicon nitride ($SiN_x$).

The QD layer may be disposed on the second insulating layer 220. The QD layer may include a first color conversion pattern RQD, a second color conversion pattern GQD, and a transmissive pattern W.

The first color conversion pattern RQD may be disposed in the first sub-pixel area. The first color conversion pattern RQD may be a red color conversion pattern. The first color conversion pattern RQD may convert the blue light provided from the blue light emitting layer 180 into a red light. For example, the first color conversion pattern RQD may include red quantum dot particles and/or a red phosphor. In addition, the first color conversion pattern RQD may further include scattering particles such as $TiO_2$.

The second color conversion pattern GQD may be disposed in the second sub-pixel area. The second color conversion pattern GQD may be a green color conversion pattern. The second color conversion pattern GQD may convert the blue light provided from the blue light emitting layer 180 into a green light. For example, the second color conversion pattern GQD may include green quantum dot particles and/or a green phosphor. In addition, the second color conversion pattern GQD may further include scattering particles such as $TiO_2$.

The red or green quantum dot may be a material having a crystal structure with a size of several nanometers, and may include hundreds to thousands of atoms. Since the size of the quantum dot is very small, a quantum confinement effect may be exhibited. The quantum confinement effect refers to a phenomenon in which an energy band gap of an object is increased when the object becomes nanometer-sized or less. Accordingly, when a light having a wavelength that has energy higher than energy of the energy band gap is incident on the quantum dot, the quantum dot may absorb the light so as to be in an excited state, and may fall to a ground state as the quantum dot emits a light having a specific wavelength. The emitted light having the specific wavelength may have a value corresponding to the energy band gap. When the size and a composition of the quantum dot are adjusted, light emission characteristics due to the quantum confinement effect may be adjusted.

The composition of the quantum dot is not particularly limited, and the quantum dot may include group II-VI elements, group III-V elements, group IV elements, or group IV-VI elements. The group II element may be at least one selected from the group consisting of zinc, cadmium, and mercury. The group III element may be at least one selected from the group consisting of aluminum, gallium, and indium. The group IV element may be at least one selected from the group consisting of silicon, germanium, tin, and lead. The group V element may be at least one selected from the group consisting of nitrogen, phosphorus, and arsenic. The group VI may be one selected from the group consisting of sulfur, selenium, and tellurium.

The transmissive pattern W may be disposed in the third sub-pixel area. The transmissive pattern W may include scattering particles that change only a traveling direction a light passing through the transmissive pattern W without changing a color of the light. Accordingly, the light passing through the transmissive pattern W may be the blue light. The scattering particles may be particles of $TiO_2$ or the like, and a size of the scattering particles may correspond to the size of the red quantum dot particles or the green quantum dot particles. In addition, the transmissive pattern W may further include a blue pigment for converting the light passing through the transmissive pattern W into a blue light.

Meanwhile, a partition wall WP may be formed between the first color conversion pattern RQD and the second color conversion pattern GQD, and the partition wall WP may include the same material as the transmissive pattern W.

The first insulating layer 210 may be disposed on the QD layer. The first insulating layer 210 may cover the color filter layer. For example, the first insulating layer 210 may include an inorganic insulating material such as silicon nitride ($SiN_x$).

The color filter layer may be disposed on the first insulating layer 210. The color filter layer may include a first color filter RCF, a second color filter GCF, and a third color filter BCF.

The first color filter RCF may be disposed in the first sub-pixel area. The first color filter RCF may be a red color filter. The first color filter RCF may allow only a wavelength band corresponding to red light to pass through the first color filter RCF.

The second color filter GCF may be disposed in the second sub-pixel area. The second color filter GCF may be a green color filter. The second color filter GCF may allow only a wavelength band corresponding to green light to pass through the second color filter GCF.

The third color filter BCF may be disposed in the third sub-pixel area. The third color filter BCF may be a blue color filter. The third color filter BCF may allow only a wavelength band corresponding to blue light to pass through the third color filter BCF.

The light blocking pattern BM may be disposed on the first insulating layer 210. The light blocking pattern BM may include a material that blocks light. For example, the light blocking pattern BM may include an organic material that absorbs light. The light blocking pattern BM may be disposed between the first to third sub-pixel areas to partition the sub-pixel areas.

The counter substrate 200 may be disposed on the color filter layer and the light blocking pattern BM. The counter substrate 200 may include a transparent insulating substrate. For example, the counter substrate 200 may be configured as a glass substrate, a quartz substrate, a transparent resin substrate, and/or the like.

Figure 3:
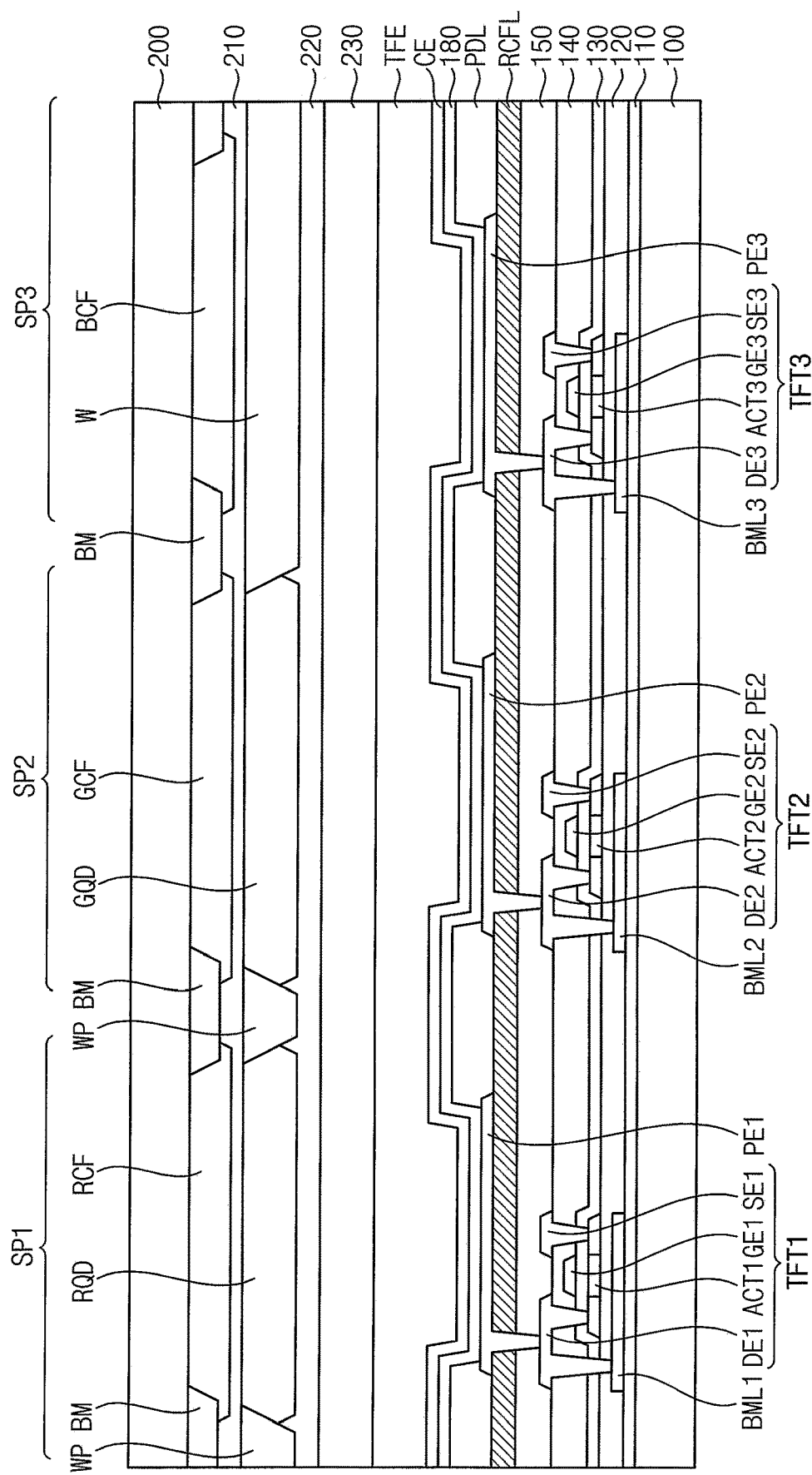
FIG. 3 is a sectional view showing first to third sub-pixels of a display device according to embodiments.

FIG. 3 is a sectional view showing first to third sub-pixels of a display device according to embodiments.

Referring to FIG. 3, the display device is substantially the same as the display device of FIG. 2 except for a position of the red color filter layer RCFL. Therefore, redundant descriptions thereof will be omitted.

The display device may include the base substrate 100, the first buffer layer 110, the lower shielding electrode, the second buffer layer 120, the active pattern layer, the gate insulating layer 130, the gate pattern, the interlayer insulating layer 140, the source/drain pattern, the via insulating layer 150, the red color filter layer RCFL, the pixel electrode layer, the pixel defining layer PDL, the blue light emitting layer 180, the counter electrode CE, the thin film encapsulation layer TFE, the adhesive layer 230, the second insulating layer 220, the QD layer, the first insulating layer 210, the color filter layer, the light blocking pattern BM, and the counter substrate 200.

The lower shielding electrode may include the first lower shielding electrode BML1, the second lower shielding electrode BML2, and the third lower shielding electrode BML3. The active pattern layer may include the first active pattern ACT1 of the first thin film transistor TFT1, the second active pattern ACT2 of the second thin film transistor TFT2, and the third active pattern ACT3 of the third thin film transistor TFT3. The gate pattern may include the first gate electrode GE1, the second gate electrode GE2, and the third gate electrode GE3. The source/drain pattern may include the first source electrode SE1, the first drain electrode DE1, the second source electrode SE2, the second drain electrode DE2, the third source electrode SE3, and the third drain electrode DE3. The pixel electrode layer may include the first pixel electrode PE1, the second pixel electrode PE2, and the third pixel electrode PE3. The QD layer may include the first color conversion pattern RQD, the second color conversion pattern GQD, the partition wall WP, and the transmissive pattern W. The color filter layer may include the first color filter RCF, the second color filter GCF, and the third color filter BCF.

The via insulating layer 150 may be disposed on the interlayer insulating layer 140 on which the source/drain pattern is disposed. The red color filter layer RCFL may be disposed on the via insulating layer 150. The pixel electrode layer may be disposed on the red color filter layer RCFL.

Figure 4:
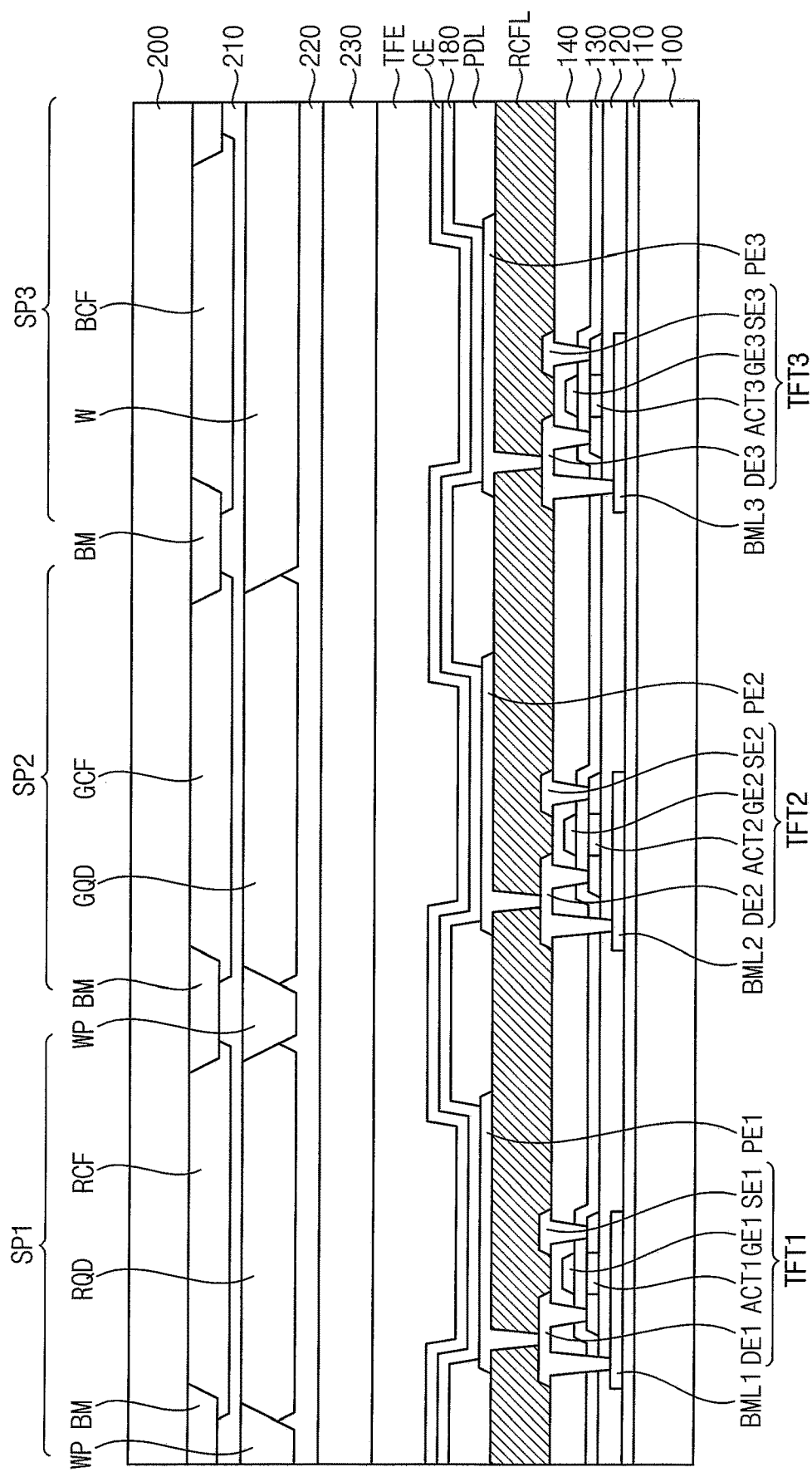
FIG. 4 is a sectional view showing first to third sub-pixels of a display device according to embodiments.

FIG. 4 is a sectional view showing first to third sub-pixels of a display device according to embodiments.

Referring to FIG. 4, the display device is substantially the same as the display device of FIG. 2 except that the red color filter layer RCFL replaces the via insulating layer so that the via insulating layer is omitted. Therefore, redundant descriptions thereof will be omitted.

The display device may include the base substrate 100, the first buffer layer 110, the lower shielding electrode, the second buffer layer 120, the active pattern layer, the gate insulating layer 130, the gate pattern, the interlayer insulating layer 140, the source/drain pattern, the red color filter layer RCFL, the pixel electrode layer, the pixel defining layer PDL, the blue light emitting layer 180, the counter electrode CE, the thin film encapsulation layer TFE, the adhesive layer 230, the second insulating layer 220, the QD layer, the first insulating layer 210, the color filter layer, the light blocking pattern BM, and the counter substrate 200.

The red color filter layer RCFL may be disposed on the interlayer insulating layer 140 on which the source/drain pattern is disposed. The red color filter layer RCFL may have a sufficient thickness to serve as the via insulating layer. Accordingly, the red color filter layer RCFL may sufficiently cover the source/drain pattern, and may have a substantially flat top surface without creating a step around the source/drain pattern.

The pixel electrode layer may be disposed on the red color filter layer RCFL. The pixel electrode layer may be electrically connected to the source/drain pattern through a contact hole formed through the red color filter layer RCFL.

Figure 5:
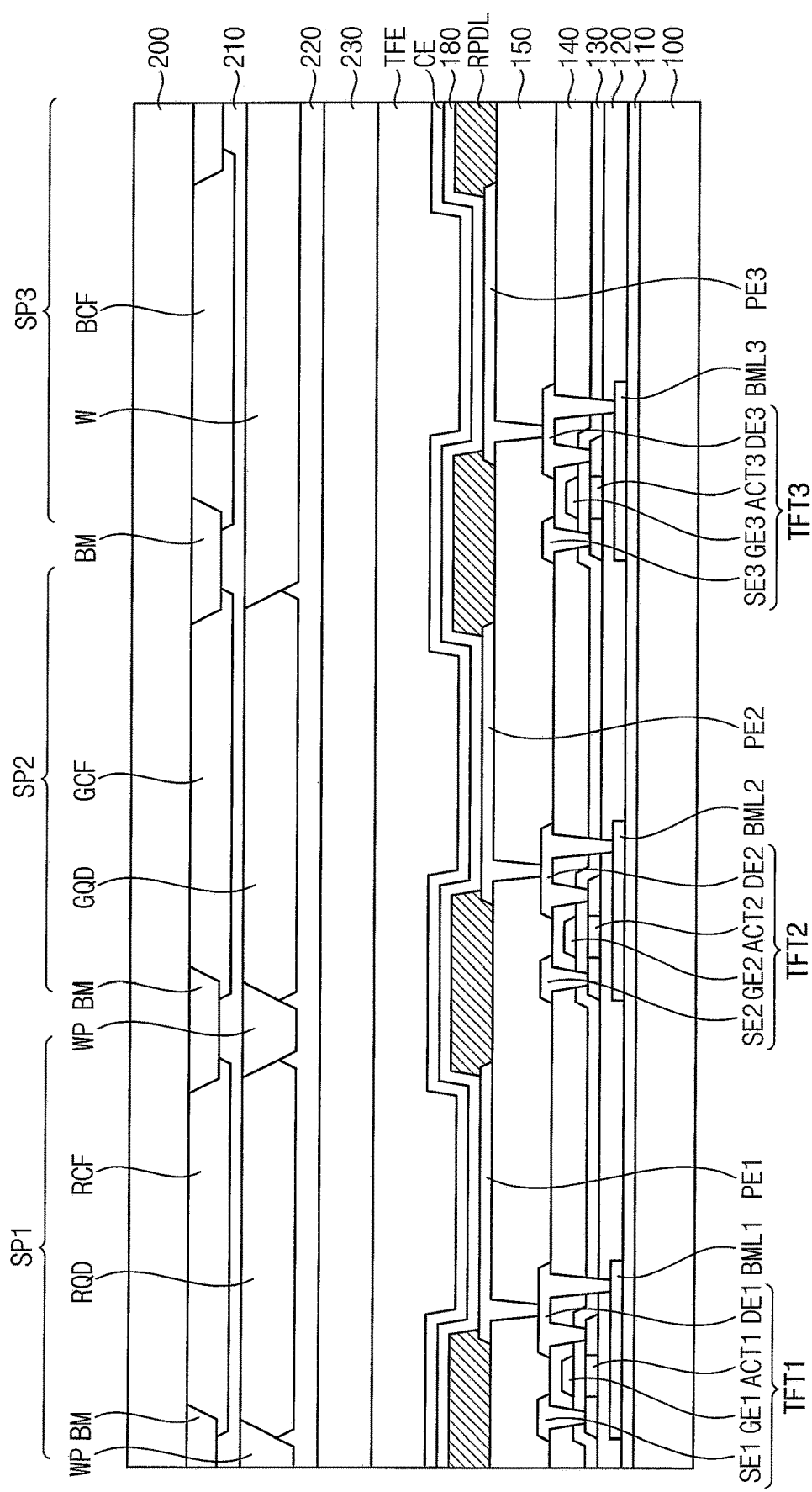
FIG. 5 is a sectional view showing first to third sub-pixels of a display device according to embodiments.

FIG. 5 is a sectional view showing first to third sub-pixels of a display device according to embodiments.

Referring to FIG. 5, the display device is substantially the same as the display device of FIG. 2 except that the red color filter layer is omitted and the pixel defining layer is changed into a red pixel defining layer RPDL. Therefore, redundant descriptions thereof will be omitted.

The display device may include the base substrate 100, the first buffer layer 110, the lower shielding electrode, the second buffer layer 120, the active pattern layer, the gate insulating layer 130, the gate pattern, the interlayer insulating layer 140, the source/drain pattern, the via insulating layer 150, the pixel electrode layer, the red pixel defining layer RPDL, the blue light emitting layer 180, the counter electrode CE, the thin film encapsulation layer TFE, the adhesive layer 230, the second insulating layer 220, the QD layer, the first insulating layer 210, the color filter layer, the light blocking pattern BM, and the counter substrate 200.

The pixel electrode layer may include the first to third pixel electrodes PE1, PE2, and PE3. The first to third pixel electrodes PE1, PE2, and PE3 may be electrically connected to the first to third thin film transistors TFT1, TFT2, and TFT3 through contact holes formed through the via insulating layer 150, respectively.

The red pixel defining layer RPDL may be disposed on the via insulating layer 150 on which the pixel electrode layer is disposed. The red pixel defining layer RPDL may be a red color filter, may allow a wavelength band of a passing light that corresponds to a red light to pass therethrough, and may block a blue light. The red pixel defining layer RPDL may have openings that partially expose the first to third pixel electrodes PE1, PE2, and PE3, respectively.

In this case, the red pixel defining layer RPDL may overlap the first to third thin film transistors TFT1, TFT2, and TFT3. Accordingly, a blue light generated from the blue light emitting layer 180 may be prevented from affecting the first to third thin film transistors TFT1, TFT2, and TFT3.

Figure 6:
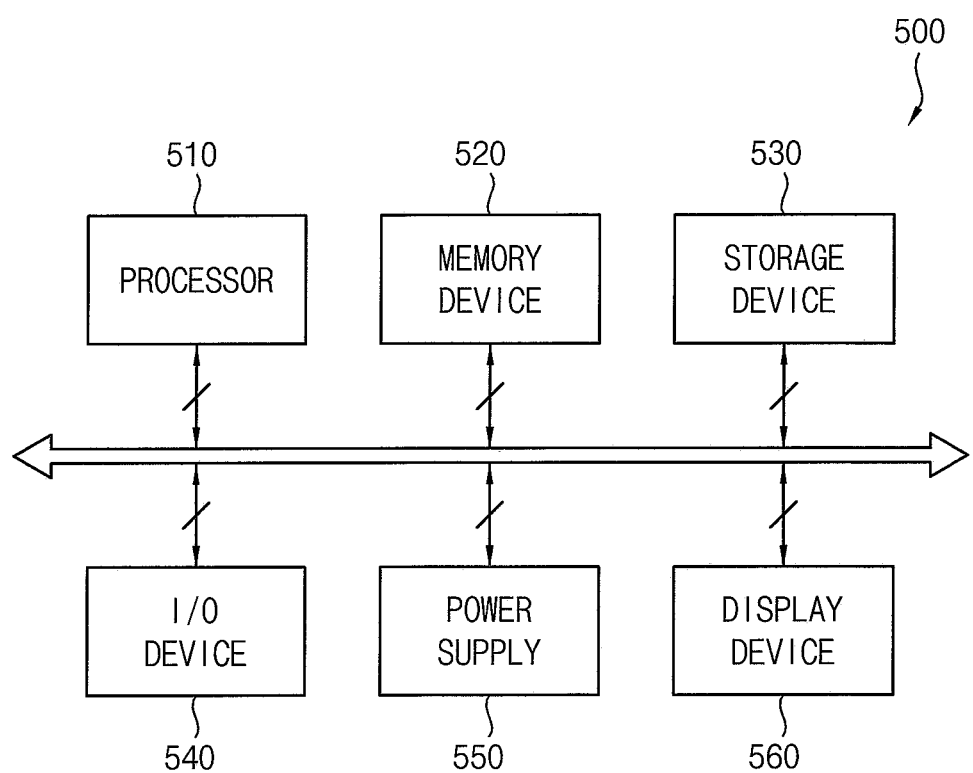
FIG. 6 is a block diagram illustrating an electronic device according to embodiments.
Figure 7A:
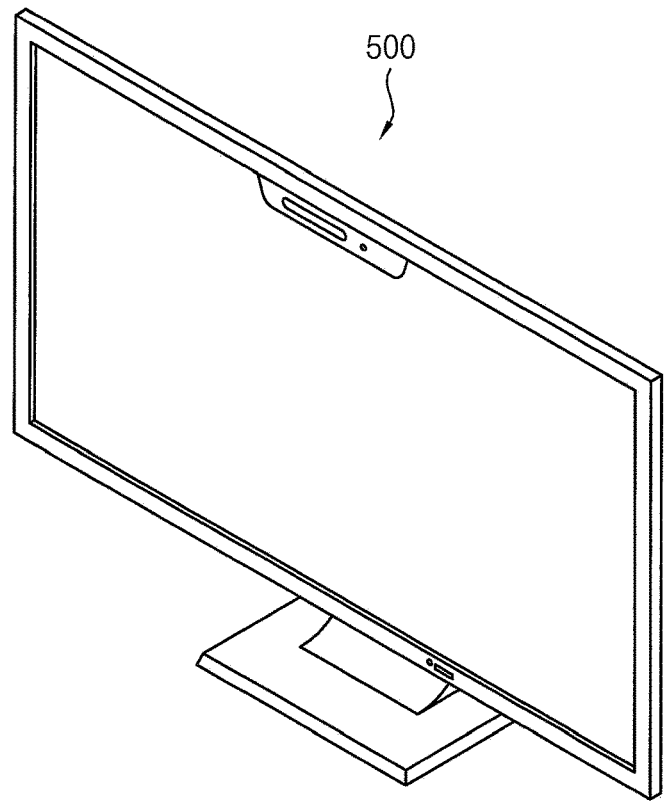
FIG. 7A is a diagram illustrating an example in which the electronic device of FIG. 6 is implemented as a television.
Figure 7B:
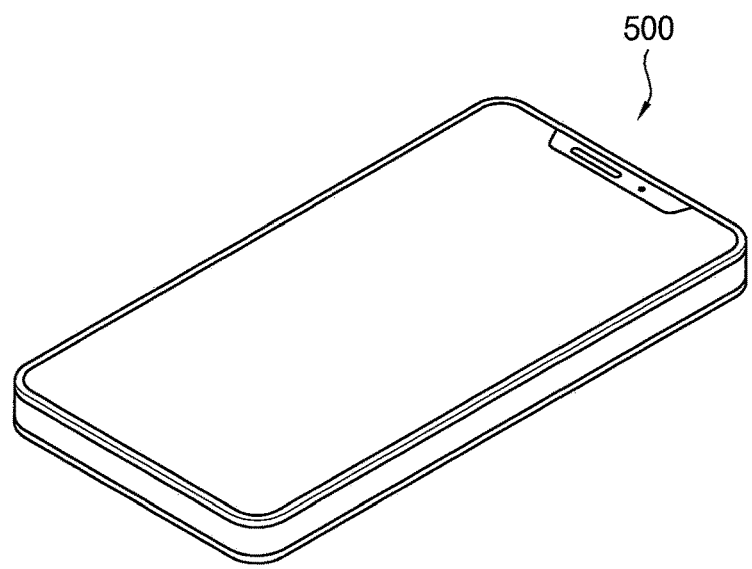
FIG. 7B is a diagram illustrating an example in which the electronic device of FIG. 6 is implemented as a smart phone.

FIG. 6 is a block diagram illustrating an electronic device according to embodiments, FIG. 7A is a diagram illustrating an example in which the electronic device of FIG. 6 is implemented as a television, and FIG. 7B is a diagram illustrating an example in which the electronic device of FIG. 6 is implemented as a smart phone.

Referring to FIGS. 6 to 7B, the electronic device 500 may include a processor 510, a memory device 520, a storage device 530, an input/output (I/O) device 540, a power supply 550, and a display device 560. Here, the display device 560 may be the display device of FIG. 1. In addition, the electronic device 500 may further include a plurality of ports for communicating with a video card, a sound card, a memory card, a universal serial bus (USB) device, other electronic devices, etc. In an embodiment, as illustrated in FIG. 7A, the electronic device 500 may be implemented as a television. In another embodiment, as illustrated in FIG. 7B, the electronic device 500 may be implemented as a smart phone. However, the electronic device 500 is not limited thereto. For example, the electronic device 500 may be implemented as a cellular phone, a video phone, a smart pad, a smart watch, a tablet PC, a car navigation system, a computer monitor, a laptop, a head mounted display (HMD) device, etc.

The processor 510 may perform various computing functions. The processor 510 may be a microprocessor, a central processing unit (CPU), an application processor (AP), etc. The processor 510 may be coupled to other components via an address bus, a control bus, a data bus, etc. Further, the processor 510 may be coupled to an extended bus such as a peripheral component interconnection (PCI) bus. The memory device 520 may store data for operations of the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc. and/or at least one volatile memory device such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device such as a keyboard, a keypad, a mouse device, a touch-pad, a touch-screen, etc., and an output device such as a printer, a speaker, etc. The power supply 550 may provide power for operations of the electronic device 500.

The display device 560 may be coupled to other components via the buses or other communication links. In some embodiments, the display device 560 may be included in the I/O device 540. As described above, the display device 560 may include a thin film transistor including an oxide semiconductor, a blue light emitting layer, a color conversion pattern, and a red color filter layer. The display device includes a color conversion structure such as quantum dots to improve color reproducibility so that the display quality can be improved, and the red color filter layer may prevent a blue light generated from the blue light emitting layer from affecting the thin film transistor including the oxide semiconductor. Accordingly, the display quality can be improved. Since these are described above, duplicated description related thereto will not be repeated.

ABILITY OF INDUSTRIAL UTILITY

The present inventive concept may be applied to a display device and an electronic device including the display device. For example, the present inventive concept may be applied to a smart phone, a cellular phone, a video phone, a smart pad, a smart watch, a tablet PC, a car navigation system, a television, a computer monitor, a laptop, a head mounted display (HMD) device, etc.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

THE DESCRIPTION OF THE REFERENCE NUMERALS

100: substrate
110: first buffer layer
120: second buffer layer
130: gate insulating layer
140: interlayer insulating layer
150: via insulating layer
180: blue light emitting layer
200: counter substrate
210: first insulating layer
220: second insulating layer
230: adhesive layer
TFT1, TFT2, TFT3: first to third thin film transistors
RCFL: red color filter layer
PDL: pixel defining layer
PE1, PE2, PE3: first to third pixel electrodes
CE: counter electrode
TFE: thin film encapsulation film
RQD, GQD: first and second color conversion patterns
W: transmissive pattern
BM: light blocking pattern
RCF, GCF, BCF: first to third color filters

The invention claimed is:

1. A display device comprising:
a base substrate comprising a first sub-pixel area, a second sub-pixel area, and a third sub-pixel area;
first to third thin film transistors on the base substrate and comprising first to third active patterns, respectively;
first to third pixel electrodes electrically connected to the first to third thin film transistors, respectively, and in the first to third sub-pixel areas, respectively;
a blue light emitting layer on the first to third pixel electrodes and configured to emit a blue light;
a first color conversion pattern in the first sub-pixel area on the blue light emitting layer;
a second color conversion pattern in the second sub-pixel area on the blue light emitting layer; and
a red color filter layer between the blue light emitting layer and the first to third active patterns,
wherein, in a plan view, an area, in which the blue light emitting layer overlaps the first to third pixel electrodes, defines a light emitting area, and
wherein the red color filter layer overlaps the defined light emitting area in the plan view.

2. The display device of claim 1, wherein the first color conversion pattern is at least one selected from among red quantum dot particles and red phosphors, and wherein the second color conversion pattern is at least one selected from among green quantum dot particles and green phosphors.

3. The display device of claim 2, further comprising:
a first color filter on the first color conversion pattern; and
a second color filter on the second color conversion pattern.

4. The display device of claim 3, wherein the first color filter and the red color filter layer comprise the same material.

5. A display device comprising:
a base substrate comprising a first sub-pixel area, a second sub-pixel area, and a third sub-pixel area;
first to third thin film transistors on the base substrate and comprising first to third active patterns, respectively;
first to third pixel electrodes electrically connected to the first to third thin film transistors, respectively, and in the first to third sub-pixel areas, respectively;
a blue light emitting layer on the first to third pixel electrodes and configured to emit a blue light;
a first color conversion pattern in the first sub-pixel area on the blue light emitting layer;
a second color conversion pattern in the second sub-pixel area on the blue light emitting layer; and
a red color filter layer between the blue light emitting layer and the first to third active patterns;
a first color filter on the first color conversion pattern;
a second color filter on the second color conversion pattern;
a transmissive pattern in the third sub-pixel area on the blue light emitting layer;
a third color filter on the transmissive pattern;
a counter substrate facing the base substrate;
a first insulating layer between the counter substrate and the first color conversion pattern, between the counter substrate and the second color conversion pattern, and between the counter substrate and the transmissive pattern, the first insulating layer comprising an inorganic insulating material; and
a second insulating layer between the blue light emitting layer and the first color conversion pattern, between the blue light emitting layer and the second color conversion pattern, and between the blue light emitting layer and the transmissive pattern, the second insulating layer comprising an inorganic insulating material, wherein the first color conversion pattern is at least one selected from among red quantum dot particles and red phosphors, and wherein the second color conversion pattern is at least one selected from among green quantum dot particles and green phosphors.

6. The display device of claim 5, further comprising:
a thin film encapsulation layer on a counter electrode; and
an adhesive layer between the thin film encapsulation layer and the second insulating layer,
wherein the counter electrode is on the blue light emitting layer.

7. The display device of claim 1, wherein the blue light emitting layer is commonly formed in the first to third sub-pixel areas.

8. The display device of claim 1, further comprising:
a via insulating layer between the red color filter layer and the first to third pixel electrodes and comprising an organic material,
wherein the first to third pixel electrodes are electrically connected to the first to third thin film transistors, respectively, through contact holes in the via insulating layer and the red color filter layer.

9. The display device of claim 1, further comprising:
a via insulating layer between the red color filter layer and the first to third thin film transistors and comprising an organic material,
wherein the first to third pixel electrodes are electrically connected to the first to third thin film transistors, respectively, through contact holes in the red color filter layer and the via insulating layer.

10. The display device of claim 1, wherein the red color filter layer is between the first to third pixel electrodes and the first to third thin film transistors and has a flat top surface, and
wherein the first to third pixel electrodes are electrically connected to the first to third thin film transistors, respectively, through contact holes in the red color filter layer.

11. The display device of claim 1, further comprising:
a via insulating layer between the first to third pixel electrodes and the first to third thin film transistors and comprising an organic material,
wherein the first to third pixel electrodes are electrically connected to the first to third thin film transistors, respectively, through contact holes in the via insulating layer, and
wherein the red color filter layer is a pixel defining layer on the via insulating layer on which the first to third pixel electrodes are located and has openings that partially expose the first to third pixel electrodes, respectively.

12. The display device of claim 11, wherein the red color filter layer overlaps the first to third thin film transistors.

13. The display device of claim 1, wherein the first to third active patterns comprise an oxide semiconductor.

14. The display device of claim 13, wherein the first to third thin film transistors further comprise first to third gate electrodes, first to third source electrodes, and first to third drain electrodes, respectively, wherein the display device further comprises:
a gate insulating layer between the first to third active patterns and the first to third gate electrodes; and
an interlayer insulating layer on the gate insulating layer on which the first to third gate electrodes are located, and
wherein the first to third active patterns are between the gate insulating layer and the base substrate.

15. The display device of claim 14, further comprising:
first to third lower shielding electrodes between the base substrate and the first to third active patterns, respectively.

16. A display device comprising:
a first sub-pixel configured to emit a red light;
a second sub-pixel configured to emit a green light; and
a third sub-pixel configured to emit a blue light,
wherein the first sub-pixel comprises a first thin film transistor, a first pixel electrode electrically connected to the first thin film transistor, a first blue light emitting layer, and a red color conversion pattern on the first blue light emitting layer,
wherein the second sub-pixel comprises a second thin film transistor, a second blue light emitting layer, and a green color conversion pattern on the second blue light emitting layer,
wherein the third sub-pixel comprises a third thin film transistor and a third blue light emitting layer, and
wherein the display device further comprises a red color filter layer between the first thin film transistor and the first blue light emitting layer, between the second thin film transistor and the second blue light emitting layer, and between the third thin film transistor and the third blue light emitting layer, and
wherein, in a plan view, an area, in which the first blue light emitting layer overlaps the first pixel electrode, defines a first light emitting area, and
wherein the red color filter layer overlaps the defined first light emitting area in the plan view.

17. The display device of claim 16, wherein the first to third thin film transistors comprise an oxide semiconductor.

18. The display device of claim 17, wherein the red color conversion pattern is at least one selected from among red quantum dot particles and red phosphors, and
wherein the green color conversion pattern is at least one selected from among green quantum dot particles and green phosphors.

19. The display device of claim 18, wherein the first to third blue light emitting layers of the first to third sub-pixels, respectively, are commonly formed and connected to each other.

20. The display device of claim 16, wherein the red color filter layer overlaps the first to third thin film transistors.

* * * * *